United States Patent
Guzman et al.

(10) Patent No.: US 7,589,552 B1
(45) Date of Patent: Sep. 15, 2009

(54) INTEGRATED CIRCUIT WITH REDUNDANCY

(75) Inventors: Mario E. Guzman, Mountain View, CA (US); Christopher F. Lane, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/977,293

(22) Filed: Oct. 23, 2007

(51) Int. Cl.
*H03K 19/003* (2006.01)

(52) U.S. Cl. .......................... 326/10; 326/38
(58) Field of Classification Search .................. 326/10, 326/38–41; 714/725, 710; 365/189.18
See application file for complete search history.

(56) References Cited

U.S. PATENT DOCUMENTS

| | | | |
|---|---|---|---|
| 5,278,839 A * | 1/1994 | Matsumoto et al. | 714/710 |
| 5,369,314 A | 11/1994 | Patel et al. | |
| 5,498,975 A * | 3/1996 | Cliff et al. | 326/10 |
| 6,034,536 A * | 3/2000 | McClintock et al. | 326/10 |
| 6,107,820 A | 8/2000 | Jefferson et al. | |
| 6,272,056 B1 * | 8/2001 | Ooishi | 365/189.18 |
| 6,344,755 B1 | 2/2002 | Reddy et al. | |
| 7,180,324 B2 | 2/2007 | Chan et al. | |
| 7,187,198 B2 * | 3/2007 | Akimichi | 326/38 |
| 7,187,597 B1 * | 3/2007 | Trimberger | 365/189.12 |
| 7,218,133 B2 | 5/2007 | Lewis et al. | |
| 7,236,008 B1 | 6/2007 | Cliff et al. | |
| 7,412,635 B1 * | 8/2008 | Trimberger | 714/725 |

* cited by examiner

*Primary Examiner*—Rexford N Barnie
*Assistant Examiner*—Crystal L Hammond
(74) *Attorney, Agent, or Firm*—Treyz Law Group; G. Victor Treyz; Nancy Y. Ru

(57) ABSTRACT

Integrated circuits such as programmable logic devices are provided that have circuit blocks such as memory blocks. The integrated circuits may be tested to determine whether the circuit blocks contain defects. If defective circuitry is identified, switching circuitry in the circuit blocks can be configured to switch redundant circuitry into use. Repairs may be made by loading repair data into fuses on the integrated circuit. Each circuit block may have an associated control circuit with a unique address. A master block repair controller may be used to route repair data to each control circuit over a shared bus using the unique addresses of the control circuits. Each control circuit may have register circuitry into which addresses and repair data are loaded. Testing circuitry may be used to supply test signals. Multiplexing circuitry can selectively route either the test signals or repair data to the control circuits over the shared bus.

21 Claims, 10 Drawing Sheets

INTEGRATED CIRCUIT WITH REDUNDANCY

BACKGROUND

This invention relates to integrated circuits, and more particularly, to integrated circuits with redundant circuitry.

Integrated circuits are manufactured using complex semiconductor fabrication techniques. One figure of merit when producing integrated circuits is a circuit's manufacturing yield. Circuits that are extremely complex or that are fabricated using cutting-edge processes are generally more difficult to produce without faults than more established circuit designs. As a result, manufacturing yields for newer and more complex circuits are sometimes lower than the manufacturing yields of older designs. Yields can also be negatively affected when designing high performance chips, because devices of this type contain smaller line widths and more complex structures, making them more difficult to manufacture.

Poor manufacturing yields can adversely affect the profitability of an integrated circuit design. In some situations, yields may be so low as to make volume production unfeasible. It is therefore desirable to enhance manufacturing yields whenever possible. This can make otherwise unprofitable integrated circuits economical to manufacture. Enhanced yields can also improve profit margins for integrated circuits that are already profitable.

Although it is beneficial to enhance manufacturing yields whenever possible, it is generally not desirable to do so at the expense of performance or die size. Increases in yield that are achieved through the use of increased die sizes or less aggressive manufacturing techniques may not be acceptable in the marketplace due to issues such as poor power consumption and poor switching speeds.

One way to improve manufacturing yields while maintaining acceptable performance involves providing integrated circuits with redundant circuitry. Following device fabrication, a newly fabricated integrated circuit can be tested. If a defect is detected, circuitry on the device may be reconfigured to bypass the defect. In doing so, spare circuitry can be switched into use in place of the bypassed defect.

This type of redundancy scheme can help to improve manufacturing yields. Devices that would otherwise need to be scrapped can be salvaged and sold to customers. Because the repair process does not adversely affect device performance, repaired devices will operate just as well as devices in which no defects were detected. There are usually a limited number of defects on a given integrated circuit, so it is generally not necessary to provide a large amount of redundant circuitry. Because only a relatively small amount of redundant circuitry is provided, the increased die area and performance penalties associated with providing redundancy are typically outweighed by the considerable economic benefits that result from achieving enhanced manufacturing yields.

Nevertheless, the amount of overhead associated with providing redundancy in modern integrated circuits has been posing challenges. The settings needed to repair a circuit are typically stored in fuses. For example, in a device that has a defective column of memory, the fuses may contain information on which column is defective and may contain settings for bypass switches. As the number of blocks of circuitry on an integrated circuit grows, the number of fuses used to implement this type of redundancy also grows. This, in turn, tends to increase the amount of circuitry used to program and test the fuse settings and increases the amount of routing resources needed to interconnect the fuses with the bypass switches. Overhead issues such as these can make redundancy schemes in complex integrated circuits burdensome.

It would therefore be desirable to be able to provide a redundancy scheme for integrated circuits that addresses these issues and by being efficient in using fuse and routing resources.

SUMMARY

In accordance with the present invention, integrated circuits such as programmable logic device integrated circuits are provided that have blocks of circuits. The circuit blocks may include, for example, memory arrays. Each memory array may have one or more spare rows or columns of memory cells. This spare circuitry may be used to provide redundancy.

Following fabrication, each integrated circuit is tested. If defective circuitry is identified, the integrated circuit may be repaired by switching the spare circuitry in the circuit blocks into place where appropriate using switching circuitry.

Each memory block may have an associated control circuit. A shared bus may be used to route data to the control circuits in parallel from a master block repair controller. Each control circuit may have a unique address. During data loading operations, each control circuit may load repair data and address information from the shared bus. Each control circuit may have a stored block address circuit that stores the unique address for that control circuit. Address comparator circuitry in each control circuit may compare the stored unique address to received addresses from the shared bus. If an address is presented on the shared bus that does not match the unique address of a given control circuit, the loaded data may be discarded. If, however, the address comparator circuitry detects a match between one of the received addresses from the shared bus and the stored unique address, the address comparator circuitry can latch the presently loaded repair data using a shadow register.

Each control circuit may have a decoder. Output signals from the decoder may be used to control the switching circuitry in the circuit block that is associated with the control circuit. When repair data is loaded into a shadow register, the outputs of the shadow register may be provided to the inputs of the decoder as undecoded repair control signals. The decoder can decode these signals to produce decoded repair control signals for the switching circuitry. The switching circuitry can be configured to bypass defective circuitry and switch redundant circuitry into use based on the decoded repair signals.

Repair data for the circuit blocks may be stored in fuses. The master block repair controller may be used to distribute the stored repair data from the fuses to the control circuits over the shared bus using the unique addresses of the control circuits. By addressing each memory block using a unique address, the amount of fuses required to implement redundancy on a given integrated circuit and the amount of interconnection resources used for distributing repair data to the circuit blocks may be minimized. The scheme is modular and can be implemented on a variety of integrated circuit platforms.

Testing circuitry may be provided on the integrated circuit to supply test signals to the circuit blocks. The shared bus may have a single data line. Multiplexer circuitry may receive test data signals from the testing circuitry and repair data signals from the master block repair controller. During repair operations, the master block repair controller may provide the multiplexer circuitry with repair data signals that the multiplexer circuitry routes to the single data line in the shared bus.

During testing operations, the testing circuitry may provide test data signals to the multiplexer circuitry that the multiplexer circuitry routes to the single data line of the shared bus.

Further features of the invention, its nature and various advantages will be more apparent from the accompanying drawings and the following detailed description of the preferred embodiments.

DETAILED DESCRIPTION

Figure 1:
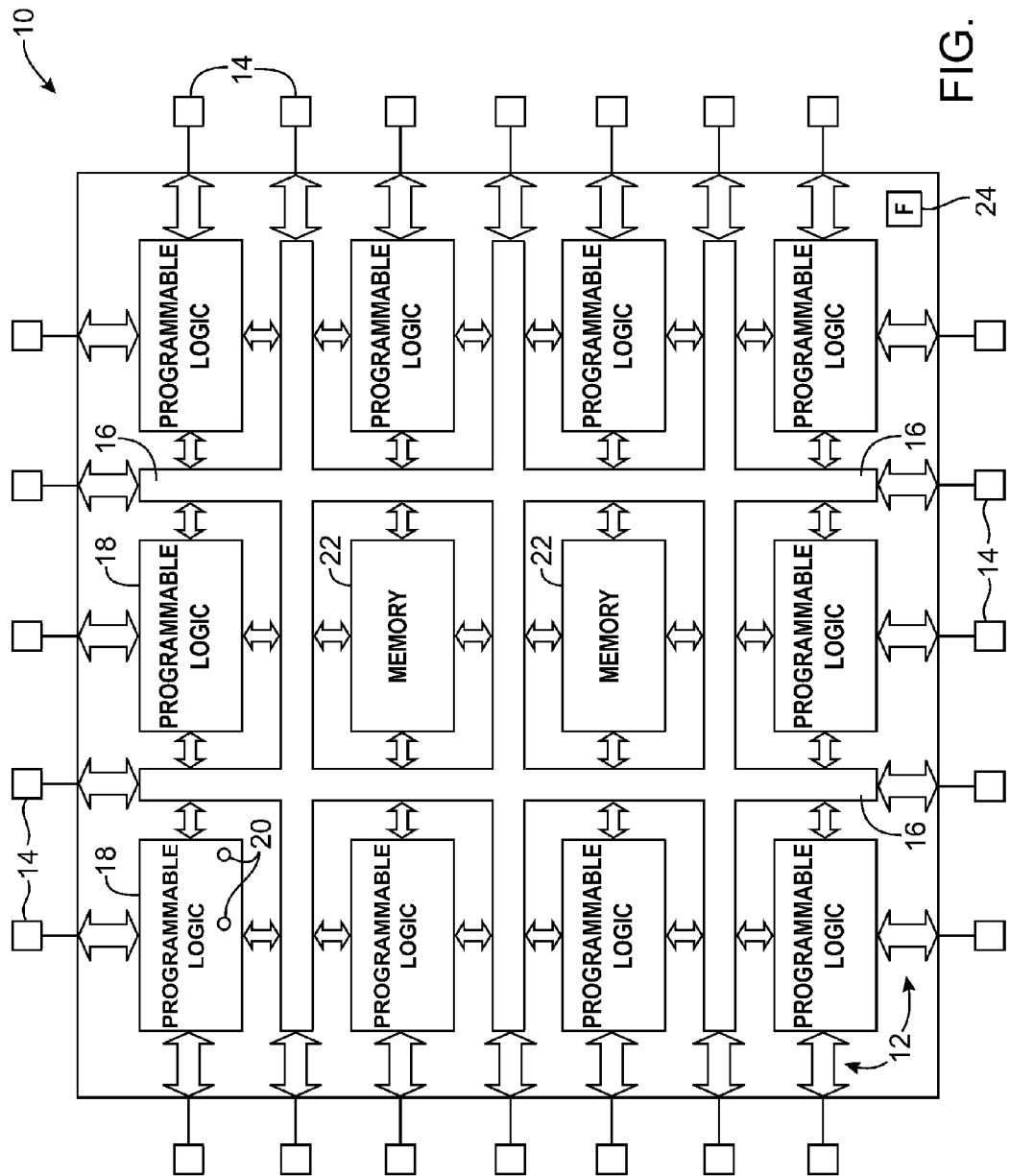
FIG. 1 is a diagram of an illustrative programmable logic device integrated circuit with redundant circuitry in accordance with an embodiment of the present invention.

The present invention relates to integrated circuits that contain redundant circuitry. Following device fabrication, integrated circuits may be tested to determine whether they contain repairable defects. If an integrated circuit contains a repairable defect, redundant circuitry on the integrated circuit may be switched into use to repair the defect. The repaired integrated circuit may then be used in a system.

Any suitable type of integrated circuit may be repaired in this way. Circuits that are particularly suitable for redundancy schemes include circuits that contain regular patterns of circuitry. As an example, an integrated circuit may contain rows of repetitive circuitry. To allow for repair of a defect, one or more additional rows of spare circuitry may be provided. (The terms "rows" and "columns" may be used interchangeably, because the difference between a row and column is merely one of perspective—rotating an integrated circuit by a quarter of a turn will change its rows into columns.)

In general, a circuit with any suitable regular pattern of circuitry can be provided with additional circuitry to support redundancy. For clarity, the present invention is sometimes described in the context of integrated circuits that contain memory arrays with redundancy. This is, however, merely illustrative. Any suitable circuitry may be provided with redundancy if desired.

Memory arrays typically contain rows and columns of memory elements. The regularity of the rows and columns of memory elements makes memory arrays particularly suitable for redundancy schemes, because redundancy can be supported by providing extra rows (or columns) of memory elements. The memory elements in an array may be volatile memory elements such as random-access-memory (RAM) cells or may be non-volatile memory elements such as electrically-erasable programmable read-only memory (EEPROM) cells. These are merely illustrative examples. Memory elements may be formed from any suitable volatile or non-volatile memory cells. Examples of volatile memory technology include memory based on static RAM cells and dynamic RAM cells. Examples of nonvolatile memory include ultraviolet light (UV) erasable programmable read-only memory, magnetic memory, fuses (e.g., fuses based on laser-programmed or electrically programmed devices such as polysilicon fuses), and antifuses.

If desired, an integrated circuit may contain both volatile and nonvolatile memory arrays. In this type of situation, both the volatile and nonvolatile memory arrays may be provided with redundancy or only one of the two types of memory arrays may be provided with redundancy.

Any suitable type of integrated circuit may contain a memory array with redundancy. For example, memory arrays with redundant circuitry may be provided on integrated circuits such as memories, digital signal processors, application-specific integrated circuits, microcontrollers, and microprocessors. With one suitable arrangement, memory arrays with redundant circuitry may be provided on programmable integrated circuits. Examples of programmable integrated circuits include programmable logic device integrated circuits and programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic.

The present invention is sometimes described herein in connection with memory arrays on programmable logic device integrated circuits. This is, however, merely illustrative. Memory arrays with redundant circuitry may be used in connection with any suitable integrated circuit if desired.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory blocks 22. Memory blocks 22 may be used to store data that is produced during the operation of device 10. Memory blocks 22 may include relatively small random-access-memory blocks of the type that are sometimes referred to as embedded array blocks (EABs) and relatively large random-access-memory blocks of the type that are sometimes referred to as mega-random-access-memory (MRAM) blocks.

Programmable logic 18 may include combinational and sequential logic circuitry. The programmable logic 18 has associated programmable memory elements 20. Memory elements 20 may be provided in one or more arrays. These arrays of memory elements 20 are used to store configuration data that configures the programmable logic to perform a custom logic function. The programmable interconnects 16 may be considered to be a type of programmable logic 18.

The configuration data, which is also sometimes referred to as programming data, can be loaded into memory elements 20 using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM or CRAM. Mask-programmed programmable logic devices, which are sometimes referred to as structured application specific integrated circuits, are programmed by using lithographic masks to create a custom pattern of connections in an array of vias based on configuration data.

Memory arrays 22 may contain rows and columns of volatile memory elements such as random-access-memory (RAM) cells. The memory arrays 22 may be used to store data signals that are produced during normal operation of device 10. The memory arrays 22 need not all be the same size. For example, small, medium, and large memory arrays 22 may be included on the same programmable logic device. There may, for example, be hundreds of small memory arrays each having a capacity of about 512 bits, 2-9 large memory arrays each having a capacity of about half of a megabit, and an intermediate number of medium size memory arrays each having a capacity of about 4 kilobits. These are merely illustrative memory array sizes and quantities. In general, there may be any suitable size and number of memory arrays 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass gates, look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination. The CRAM cells that are used to program interconnects 16 may be included in the arrays of memory elements 20 that are used to program other programmable logic on device 10.

To support redundancy, memory arrays such as the arrays of memory elements 20 and the arrays of memory elements 22 may be provided with redundant circuitry. For example, one or more additional rows or columns of circuitry may be included in arrays of memory 20 and 22. Such additional rows or columns of circuitry need not be used unless a defect is present that requires repair. Accordingly, the additional memory array rows or columns are sometimes referred to as spare or redundant rows or columns.

During a testing process following device fabrication, devices such as device 10 of FIG. 1 are tested. Testing typically involves loading test data into device 10 while applying test inputs to pins 14. Test results can be captured using internal registers. Test results can also be obtained by monitoring the signals that are produced on pins 14. By analyzing the results of tests, one or more defects may be detected.

Switching circuitry may be provided on device 10 to switch redundant circuitry into use. When a defect is detected in a memory array during testing, the switching circuitry can be configured to switch a spare row or column or memory array elements into use in place of the row or column that contains the defect.

Storage elements on device 10 are used to store the settings that are used to configure the switching circuitry. Because these settings are used to repair device 10, the settings that are used to configure the redundancy switching circuitry on device 10 are sometimes referred to as redundancy settings, repair settings, redundancy data, or repair data.

Repair settings data may be stored on device 10 using any suitable storage. With one suitable arrangement, repair data may be stored in nonvolatile memory such as electrically programmed fuses (e.g., polysilicon fuses) or laser-programmed fuses (e.g., metal fuses). Illustrative nonvolatile memory is depicted as memory 24 in device 10 of FIG. 1.

An advantage to storing repair data on device 10 in nonvolatile memory is that this allows device 10 to be permanently repaired during the testing process. During testing, one or more defects may be detected. The manufacturer may then determine which spare memory array circuits should be switched into place to repair the defects. The repair data that is needed to configure the repair switching circuitry may be stored by the manufacturer in nonvolatile memory 24 (e.g., by programming appropriate fuses). Once memory 24 has been programmed, the device 10 may be shipped to an end user for incorporation into a system. During operation, the repair data in nonvolatile memory 24 configures the switching circuitry to switch the appropriate spare circuits into use. The repaired device 10 therefore functions identically to a device 10 that contains no defects. This makes the repair process transparent to the end user, as repaired and perfect parts are indistinguishable. The use of nonvolatile memory such as memory 24 to store repair data is described herein as an example.

Circuits may be provided with redundancy by including one or more spare circuits in a block of circuitry. Spare circuits may, for example, be provided in the form of one or more extra rows of circuitry in an circuit.

Figure 2:
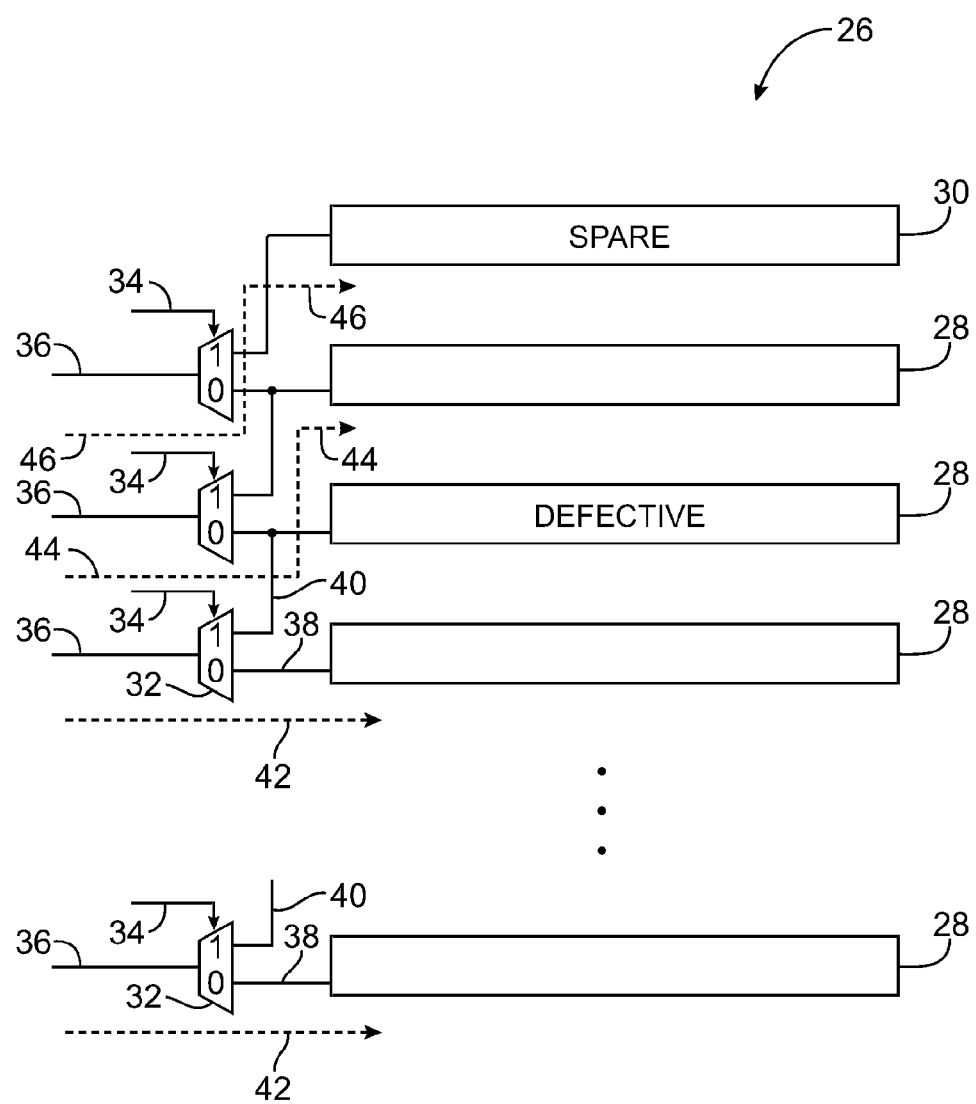
FIG. 2 is a diagram of circuitry containing a redundant circuit and a defective circuit that has been bypassed by switching the redundant circuit into use in place of the defective circuit in accordance with an embodiment of the present invention.

An illustrative circuit 26 with redundant circuitry is shown in FIG. 2. In the example of FIG. 2, circuit 26 has rows of circuits 28. Each circuit 28 may include memory elements 20 such as CRAM cells, RAM cells in a memory block 22, or other circuitry. A substantially identical circuit 30 is included in circuit 26 as a spare. Although there is only one spare circuit 30 in the example of FIG. 2, there may, in general, be any suitable number of spare circuits associated with a given circuit. For example, there may be two spare rows, three spare rows, four or more spare rows, etc.

Circuit 26 is provided with switching circuitry that selectively switches spare circuit 30 into use in place of a defective circuit when needed. In the example of FIG. 2, this switching circuitry is provided in the form of multiplexers 32 (sometimes also referred to as demultiplexers or switches).

Following device fabrication, circuit 26 is tested to determine whether any defects are present in normal circuit 28. In the event that no defects are detected, circuits 28 can be used normally. In this situation, spare circuit 30 will not be needed. Because spare circuit 30 is not needed, each multiplexer 32 may be configured to route incoming signals to its associated normal circuit 28.

Multiplexers 32 each have an associated control input 34. When the value of the control signal on an input 34 is high (i.e., a logic "1"), the input 36 of that multiplexer 32 is connected to output 40 (i.e., its "1" output). When the value of the control signal on an input 34 is low (i.e., a logic "0"), the input 36 of that multiplexer 32 is connected to output 38 (i.e., its "0" output).

In the event that spare circuit 30 is not needed, low control signals may be provided on inputs 34 to direct each multiplexer 32 to route signals on its input 36 to its output 38. This routes the signals on inputs 36 to normal circuits 28.

In the event that a defect is detected in one of circuits 28, spare circuit 30 may be switched into use to repair circuit 26. Consider, as an example, the situation in which the circuit 28 that is labeled "defective" in FIG. 2 is determined to contain a defect during testing. In this situation, the control signals on the inputs 34 of multiplexers 32 that are below the defective row may be taken low and the control signals on the inputs 34 of multiplexers 32 that are in or above the defective row may be taken high. As indicated by dotted lines 42, this routes the signals that are associated with the inputs 36 in the rows below the defective row to normal circuits 28. As indicated by dotted lines 44 and 46, the signals that are associated with the inputs 36 that are in the defective row and the rows above the defective row are each shifted upwards by one row to bypass the defective row. In particular, the signals on the input 36 that is associated with the defective row is shifted to the normal circuit 28 in the row above the defective row, as indicated by dotted line 44. Similarly, the signals on the input 36 that is associated with the normal row 28 directly above the defective row are shifted to the spare circuit 30, as indicated by dotted line 46.

As this example demonstrates, spare circuits such as spare circuit 30 can be switched into use to replace a defective normal circuit 28. The states of the repair control signals on switching circuitry control lines 34 can be set by programming appropriate fuses (nonvolatile memory 24) during the testing process. Once the fuses have been configured by the manufacturer to switch the appropriate spare circuits into use, the integrated circuit that contains the defective circuitry will be fully repaired and will function as if it were free of defects. Repaired parts and parts that contain no defects may therefore be used interchangeably.

Conventional redundancy schemes tend to consume relatively large amounts of on-chip resources. For example, conventional redundancy schemes may use a large number of fuses to store the repair settings for the switching circuitry and may use a large number of interconnects. Such conventional redundancy schemes may be unwieldy and inefficient, particularly with newer circuit designs that use larger numbers of circuits on a single die.

Figure 3:
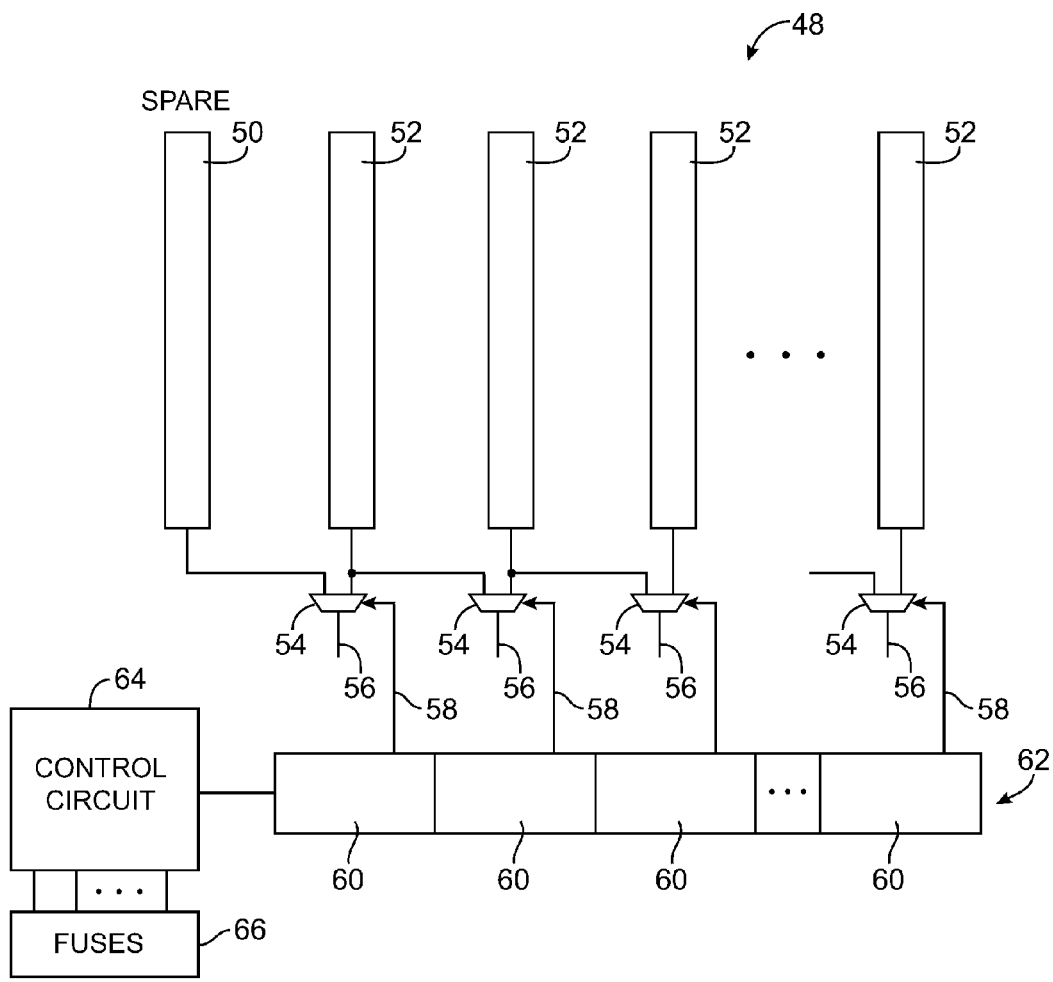
FIG. 3 is a diagram of a conventional logic circuit with redundancy.

A typical conventional redundancy scheme is shown in FIG. 3. In the arrangement of FIG. 3, circuit 48 has a number of columns of regular circuitry 52 and a spare column of circuitry 50. In the event that one of the regular circuits 52 is found to be defective during testing, multiplexers 54 can be configured to bypass the defective regular circuit 52 and switch spare circuit 50 into use. The state of each multiplexer 54 determines whether its input 56 is connected to its corresponding regular circuit 52 or to a circuit in an adjacent column.

Multiplexers 54 may be configured by control signals applied to control signal inputs 58. During testing of an integrated circuit that contains circuit 48, a manufacturer may program fuses 66 with repair data using laser programming or electrical programming techniques. Later, when the integrated circuit is powered up for use in a system, control circuit 64 may transfer the repair data from fuses 66 to shift register 62. Shift register 62 may have a number of registers 60. Each register 60 may store a corresponding repair bit. The control signals for control signal inputs 58 are determined by the states of the repair bits in registers 60.

Arrangements of the type shown in FIG. 3 have been used to repair blocks of programmable logic on programmable logic devices. In this type of arrangement, columns 52 of regular circuitry and spare column 50 contain configuration random-access-memory cells. If the programmable logic that is controlled by one of the columns of cells contains a defect, the array of CRAM cells of circuit 48 can be configured to use spare circuit 50. This switches redundant programmable logic into use to replace the defective logic.

Although the arrangement of FIG. 3 may sometimes be satisfactory, this type of arrangement requires a relatively large number of dedicated fuses 66. This is because fuses 66 are used to store repair information for an entire integrated circuit. The use of large numbers of fuses is generally not desirable, because this consumes a large amount of circuit real estate, particularly when providing sufficient clearance around fuses 66 to avoid damaging nearby circuits during electrical or laser programming operations.

Figure 4:
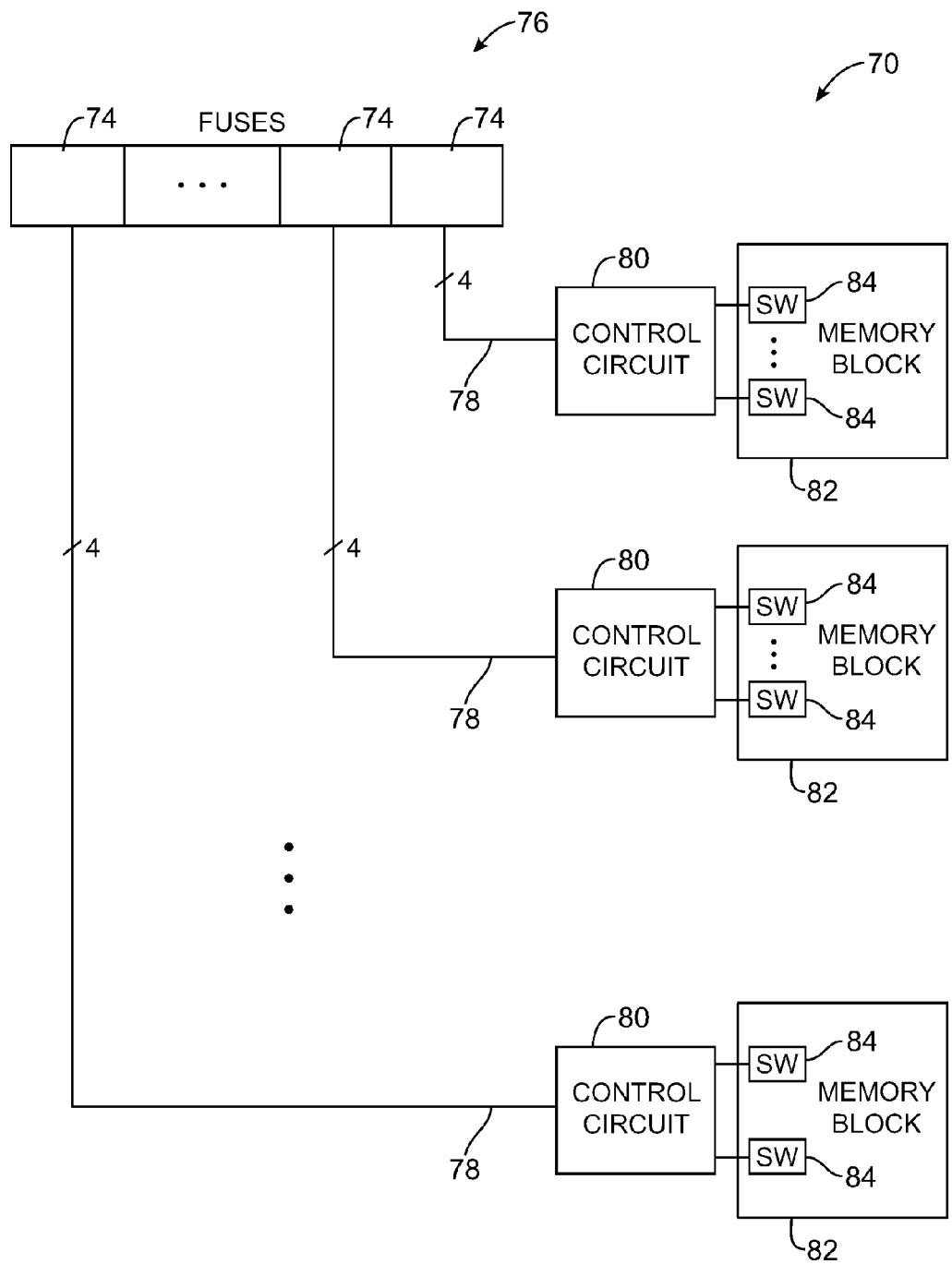
FIG. 4 is a diagram of a conventional scheme for providing redundancy for an integrated circuit with memory blocks.

Another conventional redundancy arrangement is shown in FIG. 4. Arrangements of the type shown in FIG. 4 have been used to provide redundancy for memory blocks on a programmable logic device (i.e., memory blocks such as memory blocks 22 of device 10 in FIG. 1). With the scheme shown in FIG. 4, there are multiple memory blocks 82 at different locations on an integrated circuit. Each memory block 82 contains switches 84 that can be configured to switch spare circuitry into use in the event that a defect is detected in that memory block.

During testing, a manufacturer determines which memory blocks 82 need to be repaired. A separate set of repair data is generated for each memory block 82. The manufacturer programs fuses 76 using electrical or laser programming techniques. Fuses 76 contain individual groups of fuses 74. Each fuse group 74 contains repair data for a respective memory block 82. For example, a first group of fuses 74 corresponds to a first memory block 82, a second group of fuses 74 corresponds to a second memory block, etc. Interconnect pathways 78 (sometimes called buses) are used to convey dedicated control and data signals from fuse circuitry 76 to control circuits 80. Control circuits 80 each contain a controller that latches the repair data received by that control circuit and that applies the repair data as control signals to corresponding switches 84.

With the conventional arrangement of FIG. 4, there is a dedicated interconnect pathway 78 and corresponding control circuit 80 for each memory block 82. For example, a first interconnect pathway 78 is used to route repair data from a first set of fuses 74 to the control circuit 80 for a first memory block 82 on a first portion of circuit 70, a second interconnect pathway 78 is used to route repair data from a second set of fuses 74 to the control circuit 80 for a second memory block 82, etc. The conventional arrangement of FIG. 4 uses a relatively large number of fuses 76 and a relatively large number of interconnect buses 78, which can be inefficient.

Figure 5:
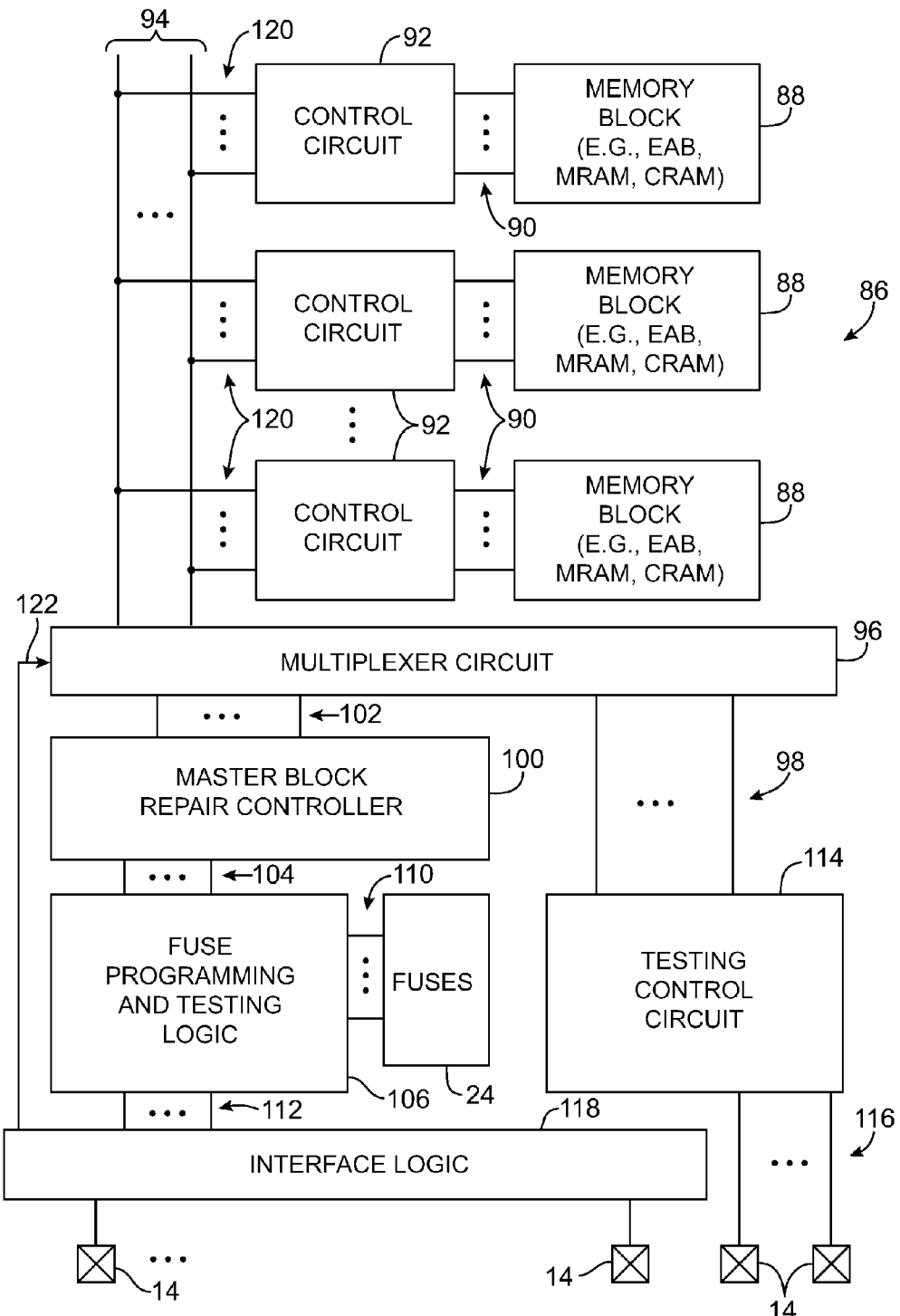
FIG. 5 is a diagram of illustrative circuitry for providing redundancy on an integrated circuit in accordance with an embodiment of the present invention.

Circuitry 86 with redundancy in accordance with the present invention is shown in FIG. 5. Circuitry 86 may be used on any suitable integrated circuit. For example, circuitry 86 may be used on a programmable integrated circuit such as programmable logic device integrated circuit 10 of FIG. 1.

As shown in FIG. 5, circuitry 86 may have multiple blocks of circuitry such as memory blocks 88. Memory blocks 88 may be located at different locations on device 10. Memory blocks 88 may be blocks of configuration random-access-memory (CRAM) cells (i.e., memory elements 20 of FIG. 1 that are loaded with programming data to configure a programmable logic device) or may be memory blocks such as memory blocks 22 of FIG. 1 (e.g., blocks of random-access-memory that are used for storing data that is produced during the normal user mode operation of device 10). Memory blocks 88 may be provided in the form of memory arrays that contain rows and columns of memory cells. One or more of the rows (or columns) in each array may be redundant. By providing spare rows (or columns) in this way, defects that are detected following device fabrication may be repaired.

In configurations in which memory blocks 88 contain CRAM cells, device 10 includes corresponding programmable logic 18 that is controlled by the programming data that is loaded into the CRAM cells. This associated programmable logic may be considered to be included in circuit blocks 88 or may be considered to be separate from the CRAM memory of blocks 88. Both defects in the programmable logic that is associated with the cells in memory blocks 88 and defects in the cells themselves may be repaired by switching spare circuits into use. Because programmable logic defects that are not contained in the CRAM cells themselves can be repaired in this way, arrangements in which memory blocks 88 are formed from CRAM cells are sometimes referred to as redundant programmable logic arrangements, whereas arrangements in which memory blocks 88 are formed from RAM cells (e.g., in memory 22 of FIG. 1) are sometimes referred to as redundant memory arrangements. However, there is generally redundant memory (e.g., spare rows or columns) in memory blocks 88 in both of these arrangements. In the following discussion, it will generally not be necessary to distinguish between configurations in which memory blocks 88 contain programmable elements 20 that are used for configuring associated programmable logic 18 and configurations in which memory blocks 88 form blocks of memory 22 of the type shown in FIG. 1.

Each memory block 88 may contain switching circuitry that can be configured to selectively switch the spare circuits into use when needed to repair defective circuitry. The switching circuitry may be based on controllable multiplexers such as the multiplexers described in connection with FIG. 2 or any other suitable adjustable circuitry.

Control circuits 92 may apply repair control signals to memory blocks 88 over respective control signal paths 90. Any suitable number of lines may be present in each path 90. For example, if a block contains switching circuitry based on 72 multiplexers, there may be 72 corresponding control lines in each path 90, each of which conveys a respective control signal from the control circuit 92 that is associated with the block to a respective one of the 72 multiplexers.

As shown in FIG. 5, there may be a control circuit 92 associated with each memory block 88. Each control circuit 92 is typically located adjacent to or within its memory block to minimize the length of the conductive traces in paths 90.

All of the control circuits 92 are connected to a path such as shared bus 94. Each control circuit 92 may have an associated set of conductive lines in a path 120 that connects that control circuit 92 to the lines in bus 94. There may be any suitable number of lines in each path 120 and any suitable number of lines in bus 94. With one suitable arrangement, there are five lines in bus 94 and five corresponding lines in each path 120.

The lines in bus 94 may include one or more data lines and one or more control lines. For example, there may be a single data line and four control lines in bus 94.

Multiplexer circuit 96 may be controlled by control signals on control path 122. There may be, for example, a single line in path 122. When a control signal on the single line in path 122 has a first value, multiplexer circuit 96 may be configured to connect signal path 102 and master block repair controller 100 to bus 94 to route repair data into control circuits 92. When the control signal on the signal line in path 122 has a second value, multiplexer circuit 96 may be configured to connect signal path 98 and testing control circuit 114 to bus 94 to test control circuits 92 and associated circuitry in memory blocks 88. Paths 102 and 98 may each contain the same number of lines as bus 94. For example, if there are five lines in bus 94, there may be five lines in path 102 and five lines in path 98.

Testing control circuit 114 may receive test signals from pins 114 via path 116. There may be any suitable number of lines in path 116.

Fuses 24 can be used to store repair data for memory blocks 88. Fuses 24 may be provided in the form of an array that is located at the edge or corner of device 10. The number of fuses 24 that is provided in the array relates to the maximum number of repairs that may be made in memory blocks 88. If many repair signals need to be applied to the switching circuits in memory blocks 88, a relatively large number of fuses 24 may be used. If only a few repair signals need to be applied to the switching circuits in memory blocks 88, fewer fuses 24 will need to be used. Unlike conventional arrangements of the type shown in FIG. 4 in which a separate group of fuses 74 is associated with each memory block, with the arrangement of FIG. 5, a single set of fuses 24 may be shared among multiple memory blocks 88. An addressing scheme may be used on bus 94 so that each control circuit 92 can recognize and receive its appropriate repair data.

Chip-wide interface logic 118 may be used to provide an interface between pins 14 and fuse programming and testing logic 106. Interface logic 118 may be used to route signals from pins 14 to fuse programming and testing logic 106 via path 112. During testing, a manufacturer uses external computing equipment (sometimes referred to as a tester) to test the circuitry of device 10. For example, the manufacturer may apply test vectors and test configuration data to device 10 to determine whether programmable logic 18 and/or memory blocks 88 contain defective circuits. If defects are detected, the tester or other external computing equipment can generate repair data for configuring the switching circuitry in blocks 88 so that redundant circuitry will be switched into place.

The repair data may be loaded into fuses 24 using pins 14, interface logic 118, path 112, fuse programming and testing logic, and path 110. Fuse programming and testing logic 106 may include circuitry that programs fuses 24 to store the repair data in fuses 24. Fuses 24 may be electrically programmable fuses such as electrically programmable polysilicon fuses. If desired, laser programming arrangements may be used in place of electrical programming arrangements. In laser programming arrangements, metal fuses or other suitable fuses 24 are loaded with repair data by selective application of laser pulses to fuses 24.

Fuses 24 (which may be antifuses) are preferably nonvolatile devices. As a result, the repair data that is programmed into fuses 24 will not be lost, even if device 10 is without power (e.g., during packaging and shipping to customers following repair operations).

When device 10 and circuit 86 are used in a system, the circuitry on device 10 will be powered. When the circuitry on device 10 is powered, fuse programming and testing logic 106 may provide the repair data from fuses 24 to master block repair controller 100 over path 104. Master block repair controller 100 may provide the repair data to control circuits 92 via path 102, multiplexer circuit 96, and shared bus 94.

Each control circuit 92 has an associated address. This allows master block repair controller 100 to route repair data to individual control circuits 92 over the same bus 94. For example, consider the situation in which the first and third memory blocks 88 on an integrated circuit require repair and the remaining memory blocks 88 on the integrated circuit do not require repair. In this scenario, master block repair controller 100 can route the repair data for the first memory block 88 to the control circuit for the first memory block by using the first memory block's address and can route the repair data for the third memory block 88 to the control circuit for the third memory block by using the third memory block's address.

With the arrangement of FIG. 5, it is not necessary to provide separate dedicated buses between master block repair controller 100 and each control circuit 92, because the control circuit addressing scheme allows bus 94 to be shared among all of the control circuits 92 and their associated memory blocks 88. The use of the control circuit addressing scheme also helps to minimize the number of fuses 24 that are required to store the repair data for circuit 86. Because one set of fuses 24 can be shared among multiple memory blocks 88, it is not necessary to over-provision fuses 24. It is only necessary to provide a sufficient number of fuses to handle the total number of repairs that are needed for circuit 86. In conventional arrangements of the type shown in FIG. 4, the fuse groups 74 that correspond to memory blocks without defects are essentially wasted.

Figure 6:
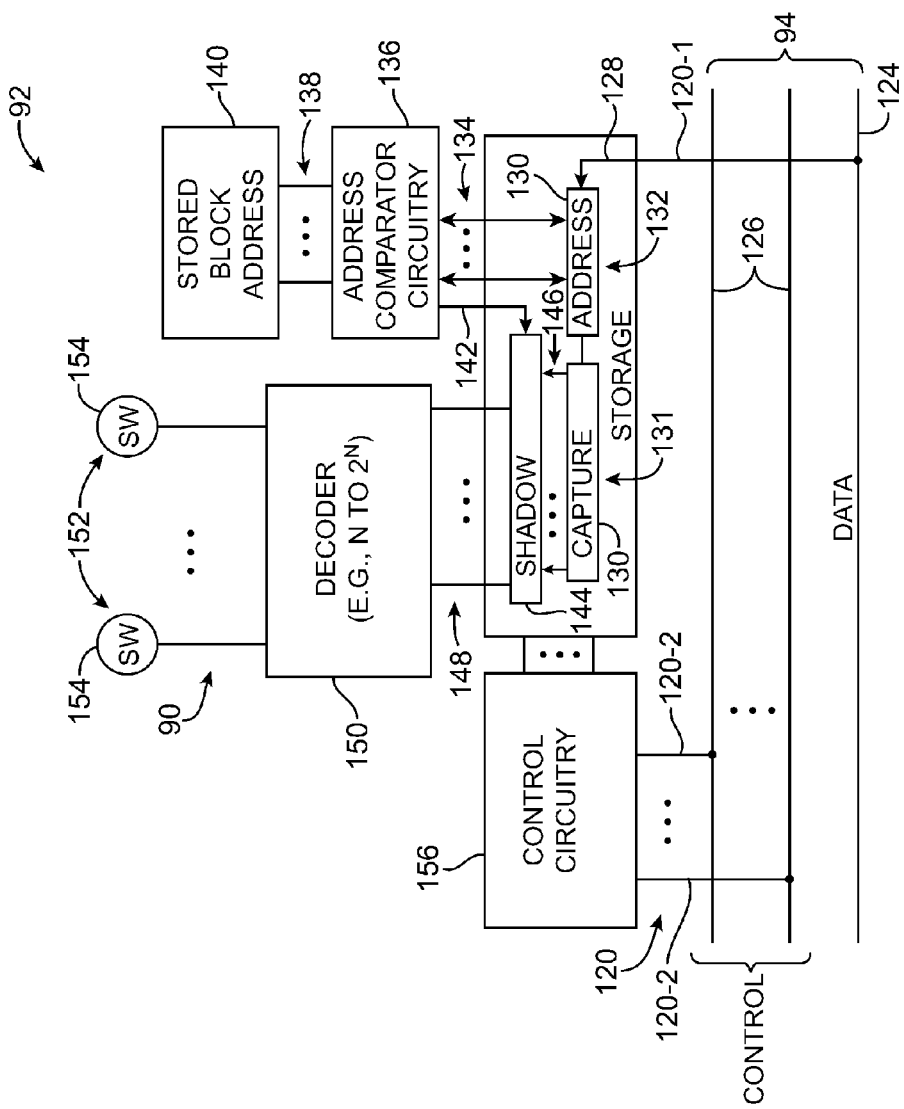
FIG. 6 is a diagram of illustrative control circuitry that may be used to control the repair of a circuit block with redundant circuitry in accordance with an embodiment of the present invention.

An illustrative control circuit 92 is shown in FIG. 6. As shown in FIG. 6, bus 94 may contain a data line 124 and control lines 126. Repair data and address information from fuses 24 may be provided over data line 124. Control signals may be provided to each control circuit 92 via control lines 126.

Each control circuit 92 may contain local storage 128 into which the repair data from fuses 24 is loaded when device 10 is powered up. Local storage may use any suitable type of memory technology. As an example, local storage 128 may be based on registers (sometimes referred to as latches or flip-flops).

In storage 128 that contains register circuitry, the register circuitry can be implemented using any suitable arrangement. An illustrative configuration of storage 128 that contains two sets of storage registers is shown in FIG. 6. In the FIG. 6 configuration, storage 128 includes capture register 130 and shadow register 144. Register 130 may contain individual registers that are connected to form a chain of registers, so register 130 may sometimes be referred to as registers 130. Similarly, register 144 may sometimes be referred to as registers 144.

Repair data and address data is initially loaded ("captured") in capture register 130. If the address that is loaded into capture register 130 matches the address of control circuit 92 and its associated memory block 88, the repair data is applied to the switching circuitry of that memory block using shadow register 144.

Capture register 130 may be loaded with memory block (or other circuit block) repair data and memory block (or other circuit block) address data using bus 94. The repair data may include a sufficient number of repair data bits to adjust the settings of switching circuitry 152 in the memory block 88 that is associated with control circuit 92. The address data may be sufficient to uniquely identify each control circuit 92 and its associated memory block. For example, if there are two memory blocks 88 in a given circuit 86, one bit of address data would be sufficient to distinguish between memory blocks. In a circuit 86 that contains four memory blocks 88, two bits of address data would be sufficient. In a circuit 86 with more memory blocks (e.g., tens or hundreds of memory blocks), proportionally larger addresses may be used.

Data line 124 in bus 94 may be connected to one end of capture register 130 using conductive line 120-1 in path 120. Control signals on lines 126 of bus 94 may be provided to control circuitry 156 over lines 120-2 in path 120. There may be any suitable number of lines 126 in bus 94. For example, there may be four lines 126. Control circuitry 156 may be used to control the loading of data into capture register 130. Control circuitry 156 may also control the loading of test data for storage 128 during testing. This test data may be used to test storage 128 and, indirectly, may be used in testing memory block 88 (e.g., by affecting the positions of the switches 154 in redundancy switching circuitry 152).

Capture register 130 (and the identical capture registers 130 in the other control circuits 92 of circuit 86) may continually load data that is presented on line 124, without regard to whether the address in the loaded data corresponds to the control circuit 92 that is loading the data. With this type of arrangement, repair data and address data is simultaneously loaded into all capture registers 130 in parallel over data line 124. Using address comparator circuitry such as address comparator circuitry 136, each control circuit 92 can determine whether the repair data that has been loaded into its capture register 130 is applicable to its memory block 88. In control circuits 92 in which the loaded address does not match, the loaded repair data is not used and is discarded during subsequent loading operations. In the control circuit 92 whose address matches the loaded address, the repair data from the capture register 130 is accepted and used to make repairs.

Any suitable circuitry may be used to determine whether a memory block address that has been loaded into storage 128 corresponds to the address of the control circuit 92 into which the address has been loaded. With the illustrative arrangement of FIG. 6, capture register 130 has two portions: repair data portion 131 and address data portion 132. During data loading, address data and repair data may be loaded serially into capture register 130 from data line 124. Repair data may be loaded first, followed by address data (as an example). Once data loading is complete, one or more bits of address data will reside in the portion of capture register 130 corresponding to address register 132 and one or more bits of repair data will reside in the portion of capture register 130 corresponding to repair data register 131.

Address comparator circuitry 136 may be connected to address register 132 via one or more conductive lines in path 134. Address comparator circuitry 136 may also be connected to stored block address circuit 140 via one or more conductive lines in path 138. The stored block address circuit 140 may contain hardwired address information. The hardwired address information that is associated with each control circuit 92 and its associated memory block 88 is preferably unique, so that each control circuit 92 and its associated memory block 88 may be individually addressed when loading repair data from fuses 24. Stored block address circuit may contain nonvolatile memory such as fuses that are blown in a pattern that establishes each stored block address circuit's unique address or may contain a pattern of circuitry that has been configured by a semiconductor fabrication mask to represent a unique address. In a typical scenario, stored block address circuit 140 presents a pattern of logic high and low signals on path 138 that address comparator circuitry 136 can compare to the logic high and low signals produced by corresponding outputs of individual registers in address register portion 132 of register 130.

Address comparator circuitry 136 can produce an enable (clock) signal on control line 142 to control shadow register 144. Shadow register 144 may be connected to the repair data portion 131 of capture register 130 via conductive lines in path 146. There may be a separate conductive line in path 146 for each register cell in shadow register 144. For example, if shadow register 144 contains a chain of eight registers, there may be eight corresponding lines in path 146 each of which connects one of the eight registers in shadow register 144 to a corresponding register in repair data portion 131 of capture register 130. Address comparator circuitry 136 can assert an enable signal on line 142 when it is desired to enable shadow register 144. When enabled, shadow register 144 loads the repair data in capture register portion 131 into shadow register 144 over path 146.

During operation, address comparator circuitry 136 monitors the addresses that are loaded into address register 132 and compares the loaded addresses to the unique address for the control circuit 92 that has been stored in stored block address circuit 140. If the address that is loaded into address register 132 does not match the address specified by stored block address circuit 140, address comparator circuitry 136 deasserts the enable signal on line 142. In this situation, shadow register 144 does not receive the repair data that has been loaded into capture register portion 131. If, however, the address that is loaded into address register 132 matches the address specified by stored block address circuit 140, address comparator circuitry 136 asserts the shadow register enable signal on line 142. This shifts the repair data that is currently in capture register portion 131 into shadow register 144, so that the repair data may be used to make repairs to the memory block 88 that is associated with the control circuit 92.

The output of shadow register 144 may be connected directly to the control inputs of switching circuitry 152 or may be connected to the control inputs of switching circuitry 152 through intermediate circuitry such as decoder 150. An advantage of using decoder 150 is that this may reduce the number of registers needed to implement capture register 130 and 144 and may reduce the number of fuses 24 that are required to store repair data on device 10.

As shown in FIG. 6, the output of shadow register 144 may be connected to decoder 150 using path 148. Path 148 may contain any suitable number of signal lines. If, for example, shadow register 144 contains eight registers, each of the eight registers may be connected to one of eight corresponding inputs of decoder 150 via a corresponding line in path 148. Decoder 150 may be an $N:2^N$ decoder such as an $8:2^8$ decoder. When this type of decoder circuit is used, there may be up to $2^N$ lines in path 90 for controlling switching circuitry 152. The states of the lines in path 90 (i.e., whether they produce logic high or low output control signals) are controlled by the states of the decoder inputs signals on path 148. The decoder input signals on path 148 represent undecoded repair control signals. The output signals on path 90 represent decoded repair control signals.

Switching circuitry 152 may be provided using any suitable switches 154. With one suitable arrangement, each switch 154 is formed from a multiplexer such as one of multiplexers 32 in the example of FIG. 2. As with multiplexers 32 of FIG. 2, each switch 154 may have a respective control input such as inputs 34 of FIG. 2. Each switch 154 may also have a signal input such as signal inputs 36 in FIG. 2 and two signal outputs such as outputs 38 and 40 in FIG. 2. Each switch 154 in the switching circuitry 152 of a memory block may be associated with a row or column of memory cells or other circuit elements in the memory block 88.

Figure 7:
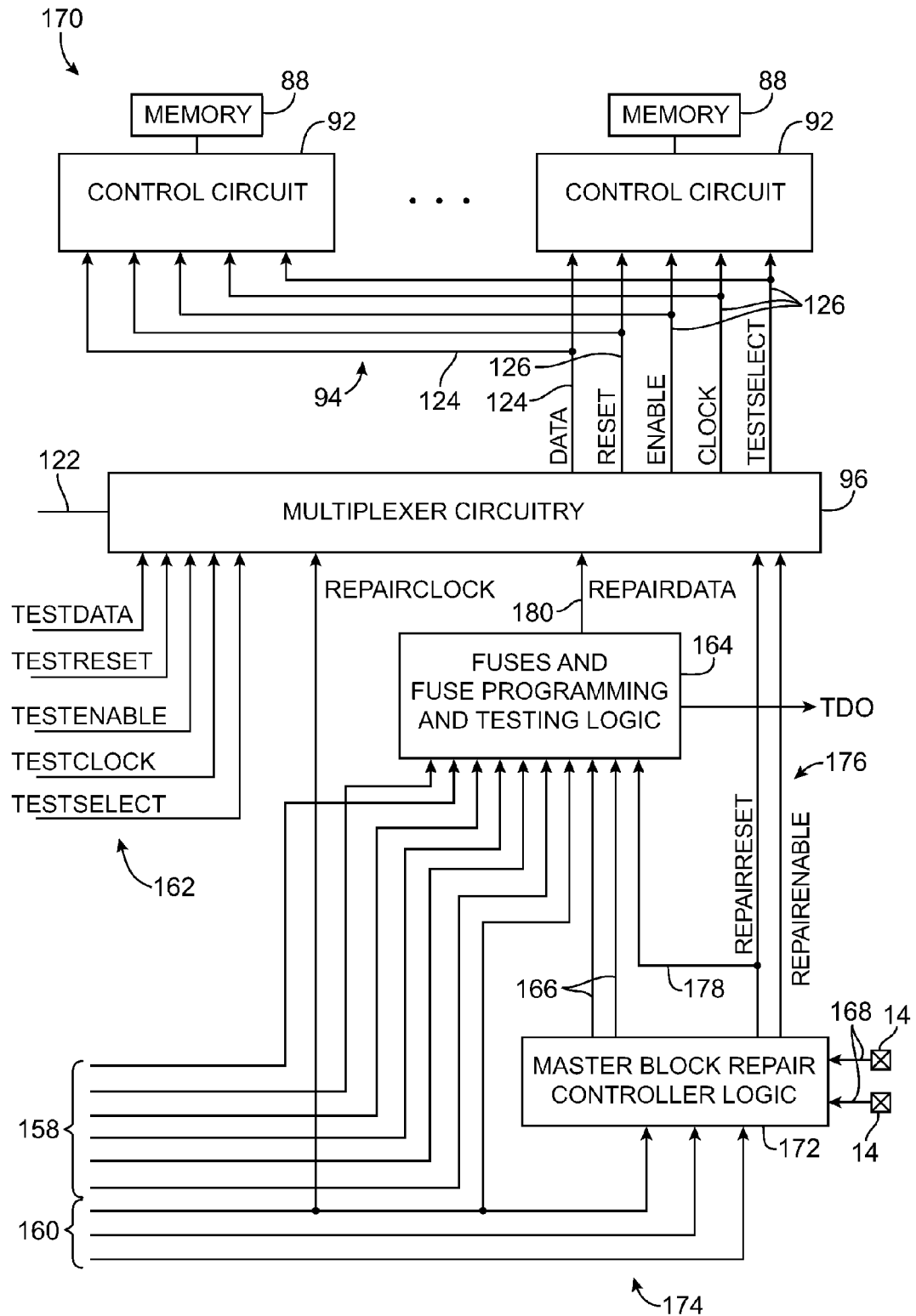
FIG. 7 is a diagram of illustrative circuitry for providing redundancy on an integrated circuit in accordance with an embodiment of the present invention.

The circuit diagram of FIG. 7 shows details of illustrative circuits and control signals that may be used in repairing blocks of circuitry over shared bus 94. Circuitry 170 may be formed on a programmable integrated circuit such as programmable logic device integrated circuit 10 of FIG. 1 or any other suitable integrated circuit. Circuitry 170 includes blocks of memory 88. Each memory block 88 may have an associated control circuit 92. The control circuits 92 may be connected to a shared bus 94. Shared bus 94 may have a data line that carries data signals DATA. Shared bus 94 may also have control signal lines that carry control signals RESET, ENABLE, CLOCK, and TESTSELECT.

Memory blocks 88 and associated control circuits 92 may be arranged on an integrated circuit in any suitable pattern. For example, memory blocks 88 and control circuits 92 may be arranged in a row or column (i.e., as a linear one-dimensional array). If desired, memory blocks 88 may also be arranged in a two-dimensional array pattern (i.e., using rows and columns, each of which contains at least two memory blocks 88). Regardless of the particular layout that is used for memory blocks 88, shared bus 94 is preferably routed so that it provides signals DATA, RESET, ENABLE, CLOCK, and TESTSELECT to each memory block's control circuit 92. Sharing bus 94 between memory blocks in this way helps to reduce the amount of interconnect resources that are consumed in providing repair data to memory blocks 88.

Figure 8:
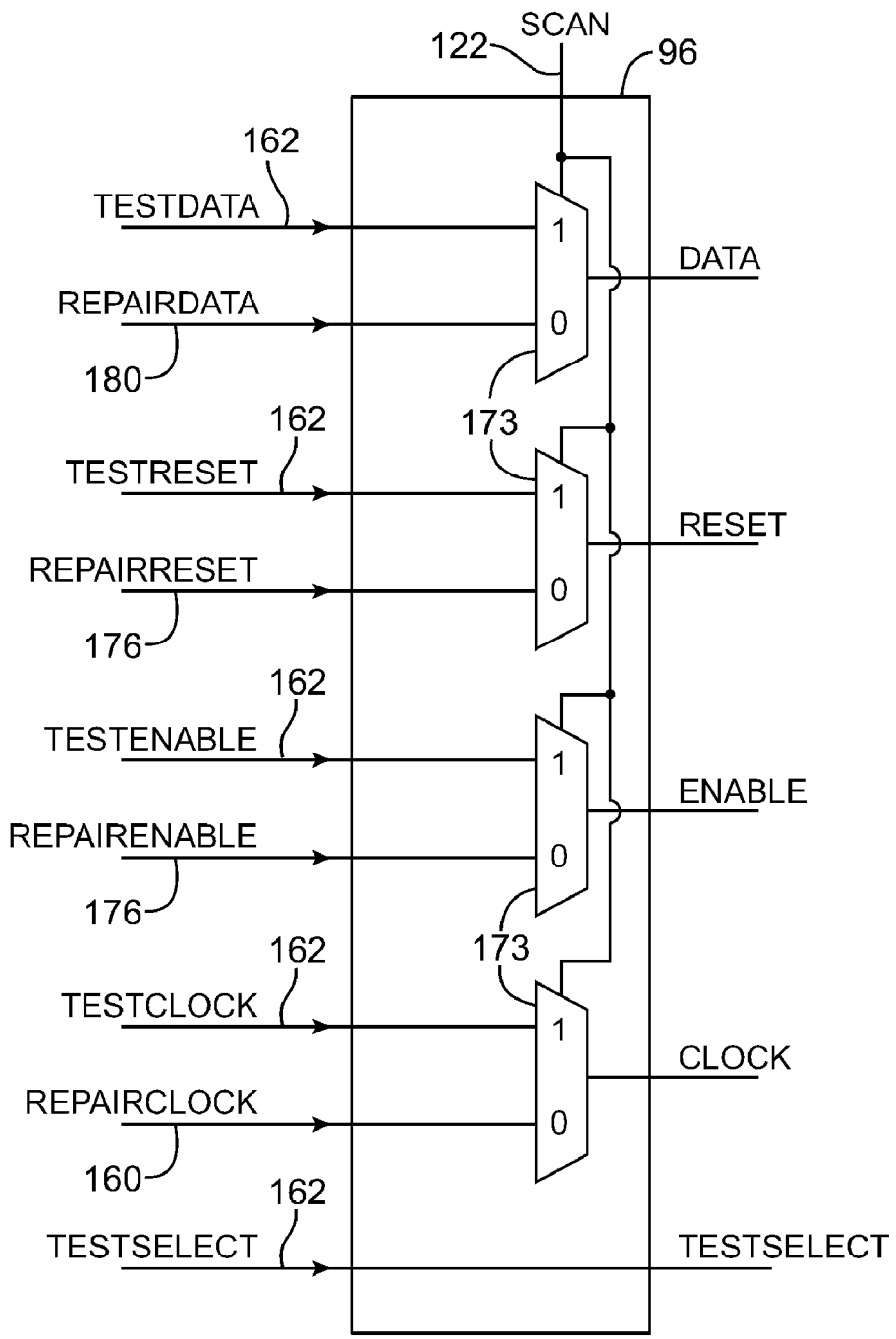
FIG. 8 is a diagram of illustrative multiplexer circuitry that may be used in circuitry for providing redundancy on an integrated circuit in accordance with an embodiment of the present invention.

Multiplexer circuitry 96 may be controlled by a signal that is provided to control input 122 of multiplexer circuitry 96. An illustrative multiplexer circuit 96 is shown in FIG. 8. As shown in FIG. 8, the control signal on line 122 may be applied to the control inputs of multiplexers 173.

When the control signal has one value (e.g., a logic low), the circuitry of multiplexer 96 is configured to support repair operations. In this configuration, the repair inputs of multiplexers 173 are connected to their outputs. Signal REPAIRDATA serves as signal DATA, signal REPAIRRESET serves as signal RESET, signal REPAIRENABLE serves as signal ENABLE, and signal REPAIRCLOCK serves as signal CLOCK. Input signal TESTSELECT, which is unaffected by the state of the signal on control input 122 serves as output signal TESTSELECT.

When the control signal on line 122 has another value (e.g., a logic high), multiplexer 96 is configured to support testing operations. In this situation, the test inputs of multiplexers 173 are connected to the outputs of multiplexers 173. Each test signal is routed to an appropriate output. Signal TESTDATA serves as signal DATA, signal TESTRESET serves as signal RESET, signal TESTENABLE serves as signal ENABLE, and signal TESTCLOCK serves as signal CLOCK. Input signal TESTSELECT is unaffected by the state of the signal on control input 122 and serves as output signal TESTSELECT.

As shown in FIG. 7, multiplexer circuitry 96 may receive test signals TESTDATA, TESTRESET, TESTENABLE, TESTCLOCK, AND TESTSELECT from test control signal lines 162. Multiplexer 96 may receive signal REPAIRCLOCK from one of lines 160. The signals on lines 160 are control signals for functions such as initialization, power-on-reset, and clock. These signals are used to initialize master block repair controller logic 172 (e.g., by clearing internal registers associated with state machine logic in master block repair controller logic 172) and are provided to master block repair controller logic 172 over path 174.

Master block repair controller logic 172 receives fuse testing control signals from pins 14 over paths 168. Signals REPAIRRESET and REPAIRENABLE are provided to multiplexer circuitry 96 by master block repair controller logic 172 over path 176. Signal REPAIRRESET is also provided to fuses and fuse programming and testing logic 164 via path 178 to reset fuse registers in fuses and fuse programming and testing logic 164 before loading programming data into fuses and fuse programming and testing logic 164.

Control signals on lines 158 are used to program the fuses in fuses and fuse programming and testing logic 164 with repair data.

After fuse programming, master block repair controller logic 172 uses the control signals on lines 166 and 178 to instruct the fuses and fuse programming and testing logic 164 to provide repair data on line 180 as signal REPAIRDATA. During repair operations, this repair data is provided to control circuits 92 as signal DATA via line 124 in shared bus 94.

Signal line TDO is used to supply fuse testing output signals to external equipment (e.g., a tester) during testing operations. Test data out pins may also be associated with groups of one or more memory blocks 88. For example, if memory blocks 88 are arranged in a two-dimensional array containing rows and columns of blocks 88, there may be a test data out pin associated with each column of blocks to provide an output for test results.

The signal TESTSELECT is generally only active in test mode and may be used to select whether capture register 130 or shadow register 144 is being tested. During test mode, test control and data signals from path 162 are used to perform testing on control circuits 92. Additional circuitry on the integrated circuit such as memory blocks 88 and programmable logic 18 that is configured using memory blocks 88 may also be tested during test operations. Such test operations may, for example, be performed while test control and test data signals that originate on path 162 are provided to control circuits 92 over bus 94. The signals on paths such as paths 122, 162, 158, 160, and 168 may be provided from pins 14, from interface logic such as interface logic 118 of FIG. 5, or any other suitable circuitry. These signals may be generated by an external tester (as an example).

Figure 9:
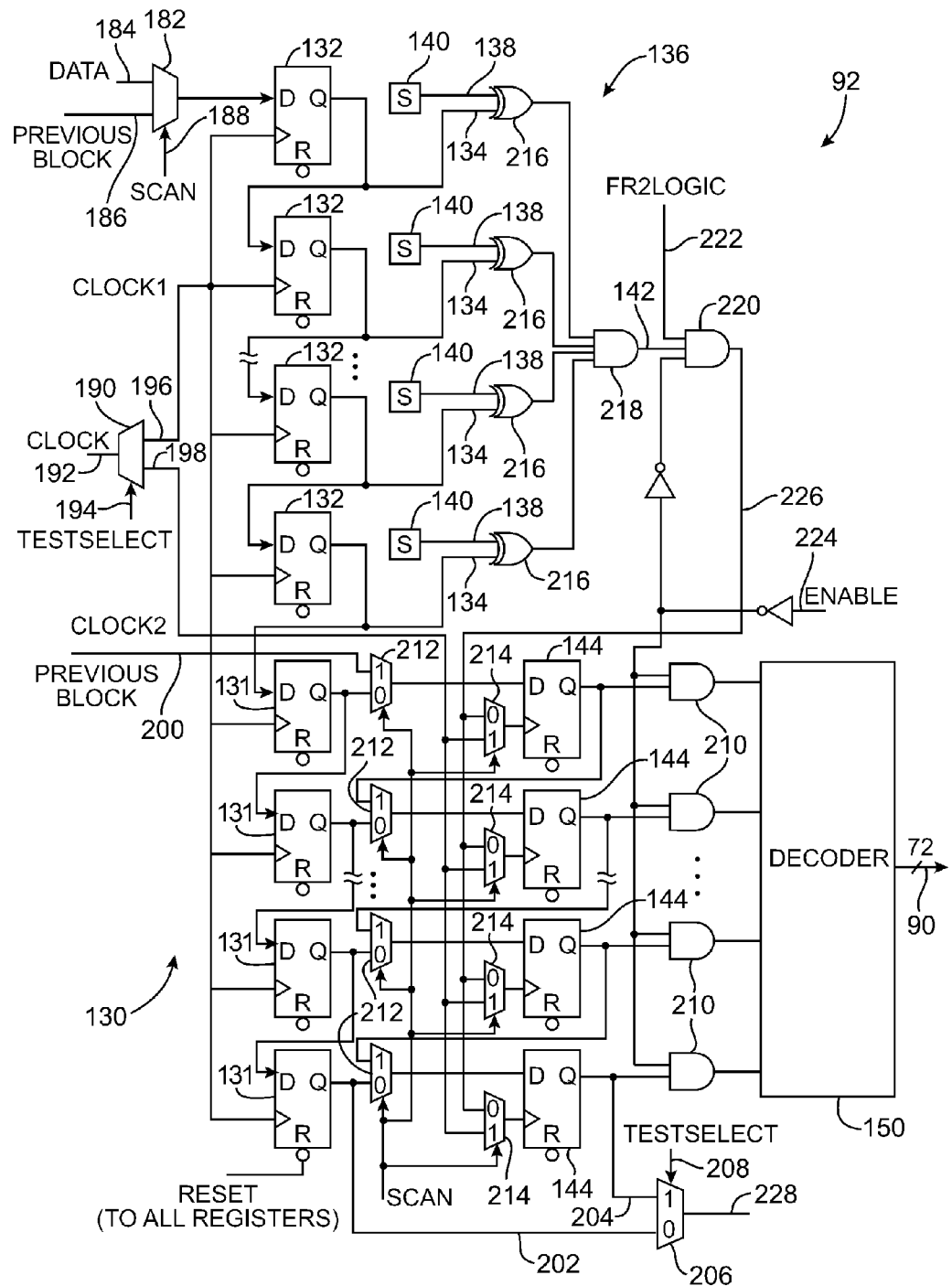
FIG. 9 is a diagram of illustrative control circuitry that may be used to control the repair of a circuit block with redundant circuitry in accordance with an embodiment of the present invention.

Illustrative control circuitry 92 that receives the signals DATA, RESET, ENABLE, CLOCK, and TESTSELECT on bus 94 is shown in FIG. 9. Control circuitry 92 can be operated in multiple modes.

For example, when it is desired to test an integrated circuit, the control circuitry 92 and other circuitry on the integrated circuit may be tested by entering a test mode. During test mode, scan chains of registers may be formed. The scan chains may be used to load test data and may be used to capture and unload test results.

When it is desired to repair faults that have been detected in the integrated circuit, the control circuitry 92 and other circuitry on the integrated circuit may be placed in a repair mode. During the repair mode, repair data can be loaded into the control circuits. Following repair operations, the integrated circuit may be used to support normal operations in a system. These normal operations are typically referred to as user mode operations. The control signals that are applied to circuit 92 are used to configure control circuit 92 so that control circuit 92 may be used to perform operations that are appropriate for each of these different modes.

In the illustrative arrangement of FIG. 9, the capture register 130 of control circuit 92 is formed from a series of eight address registers in address register portion 132 and seven repair data registers in repair data portion 131. Capture register 144 may be made up of seven individual capture registers. These register sizes are merely illustrative. In general, shadow register 130 and its associated address register portion 132 and data register portion 131 may have any suitable number of individual registers. Capture register 144 may also have any suitable number of individual registers.

As shown in FIG. 9, each individual register has an input (labeled "D") that receives data from a corresponding input line. Each individual register also has an output (labeled "Q") that supplies output data. The individual registers also each include a reset terminal (labeled "R") that receives signal RESET and each include a clock input. The capture register 130 is formed by connecting the output Q of each of the individual capture register registers to the input D of a corresponding adjacent individual register.

The outputs Q in shadow register 144 can be selectively connected in this type of chain when multiplexers 212 have their "1" inputs connected to their outputs (i.e., when control signal SCAN is high). When multiplexers 212 have their "0" inputs connected to their outputs (i.e., when signal SCAN is low), shadow register 144 receives data at inputs D in shadow register 144 from outputs Q in data portion 131 of capture register 130.

Multiplexers 214 may be used to select the source of the clock signals for shadow register 144. When SCAN is high, capture register 144 receives clock signals CLOCK2 from line 198. When SCAN is low, capture register 144 receives clock signals (i.e., an address comparator enable signal) from line 226.

The signal RESET may be used to reset the capture register 130 and the shadow register 144. During testing operations, the signal TESTSELECT may be used to determine whether capture register 144 or shadow register 130 is being tested.

If signal TESTSELECT on lines 208 and 194 is high (i.e., if TESTSELECT is asserted on its associated control line in bus 94), shadow register 144 may be tested. During shadow register testing, the signal CLOCK is routed from line 192 to line 198 via demultiplexer 190 (switch 190) and serves as clock signal CLOCK2. In this situation, multiplexer 206 will have its shadow register input 204 connected to its output 228, so that shadow register 144 may be tested.

If signal TESTSELECT is low, capture register 130 may be tested. During capture register testing, clock signal CLOCK is routed from input 192 to line 196 through demultiplexer 190 and serves as clock signal CLOCK1 for the capture register. Multiplexer 206 has its capture register input 202 connected to its output 228, so that capture register 130 may be tested.

Test data from multiplexer 206 may be output on line 228. Line 228 may be connected to another control circuit 92 so that the chains of registers in control circuits 92 can be connected form a scan chain for testing. Each control circuit 92 may have test data inputs such as inputs 186 and 200 that allow control circuit 92 to receive output test data from a previous control circuit 92 (i.e., a control circuit 92 that is associated with a previous memory block 88). When receiving test data from previous control circuits 92, signal SCAN is asserted (i.e., SCAN is taken to a logic "1" value), thereby configuring multiplexers 182, 212, and 214 appropriately.

During repair mode, signal SCAN is deasserted (i.e., SCAN is taken to a logic "0" value). This configures multiplexer 182 to route data signal DATA into capture register 130 from line 184, which may be connected to line 120-1 of FIG. 6.

Stored block address circuit 140 may be implemented using data storage cells S. During fabrication, each storage cell S may be hardwired so that it supplies an appropriate bit of address data on its output. For example, some of the storage cells S may be hardwired to produce a positive power supply voltage Vcc (i.e., a logic "1" value) on their outputs and some of the storage cells S may be hardwired to produce a ground power supply voltage Vss (i.e., a logic "0" value) on their outputs. The pattern of each set of storage cells S in each circuit block 92 represents the address of that circuit block 92 and its associated memory block. To ensure that each circuit block 92 and its associated memory block 88 may be individually addressed, the pattern of address bits that is stored in each circuit block's storage cells S is preferably unique. Using mutually exclusive addresses in this way allows the switching circuitry 152 in each memory block to be separately configured to repair the specific pattern of circuit defects present in that memory block.

Address comparator circuitry 136 may be formed from logic circuitry such as exclusive OR gates 216 and AND gate 218. The hardwired address of the control circuit 92 is received on path 134. During data loading operations, signal DATA on line 184 is directed by multiplexer 182 into capture register 130. Repair data is loaded into repair data portion 131 of capture register 130, whereas address data is loaded into address register portion 132 of register 130. The address register data that has been loaded into address register portion 132 is routed from its Q outputs to address comparator circuitry 136 via path 134. Address comparator circuitry 136 compares the address that has been loaded into address register 132 to the circuit block's unique address and produces a corresponding enable signal on path 142 at the output of AND gate 218.

The enable signal on path 142 at the output of address comparator circuitry 136 is routed to the clock inputs of shadow register 144 via gate 220, path 226, and multiplexers 214. During repair operations, signal SCAN is low ("0"), so multiplexers 214 are configured to connect their "0" inputs to their outputs. The outputs of multiplexers 214 are connected to the clock inputs of shadow register 144. When the enable signal from line 142 is applied to the clock inputs of shadow register 144, the D inputs of shadow register 144 receive the data that is supplied from the Q outputs of repair register portion 131 of capture register 130. The enable signal on line 142 is only asserted when the address of the circuit block 92 matches the address that has been loaded into address register 132, so capture register 144 is only loaded with the repair data from repair register portion 131 when there is a match in addresses.

During repair operations, the capture registers of all control circuits are loaded with data (i.e., data signal DATA) in parallel using the shared data line 124 of bus 94, but only a control circuit 92 that has a hardwired address that matches the address in the loaded data will load the repair portion of the loaded data from its capture register 130 into its shadow register 144. Once loaded into shadow register 144, the output signals from shadow register 144 (on outputs Q) are passed via AND gates 210 to decoder 150.

Decoder 150 decodes the undecoded repair control signals that are presented to its inputs and produces corresponding decoded repair control signals on its outputs. These repair control signals are applied over path 90 to switching circuitry 152 (e.g., multiplexers such as multiplexers 32 in FIG. 2 or other suitable switches 154) in the memory block 88 that is associated with the control circuit. This configures the switching circuitry to switch redundant circuitry into use in place of defective circuitry, thereby repairing the memory block. Once all memory blocks 88 on device 10 have been repaired, device 10 may be placed in user mode and used to support normal operations in a system.

A signal FRZLOGIC may be asserted on line 222 when transitioning into user mode from repair mode. This ensures that the repair settings are only activated after user mode has been entered. An AND gate 220 may receive the FRZLOGIC signal from line 222, the shadow register enable signal on line 142, and the ENABLE signal on line 224. The signal ENABLE determines whether control circuit 92 is in test mode or repair mode. In test mode, ENABLE is low, so that the signal on line 226 is low and no data is latched into shadow register 144. When it is desired to repair device 10 ENABLE is taken high, so that the Q outputs of register 144 are able to pass to the inputs of decoder 150 via AND gates 210. The signal FRZLOGIC is also taken high so that the high capture register enable signal on line 142 is able to propagate to line 226, thereby clocking the repair data into capture register 144 and switching the redundant circuitry on device 10 into use.

Figure 10:
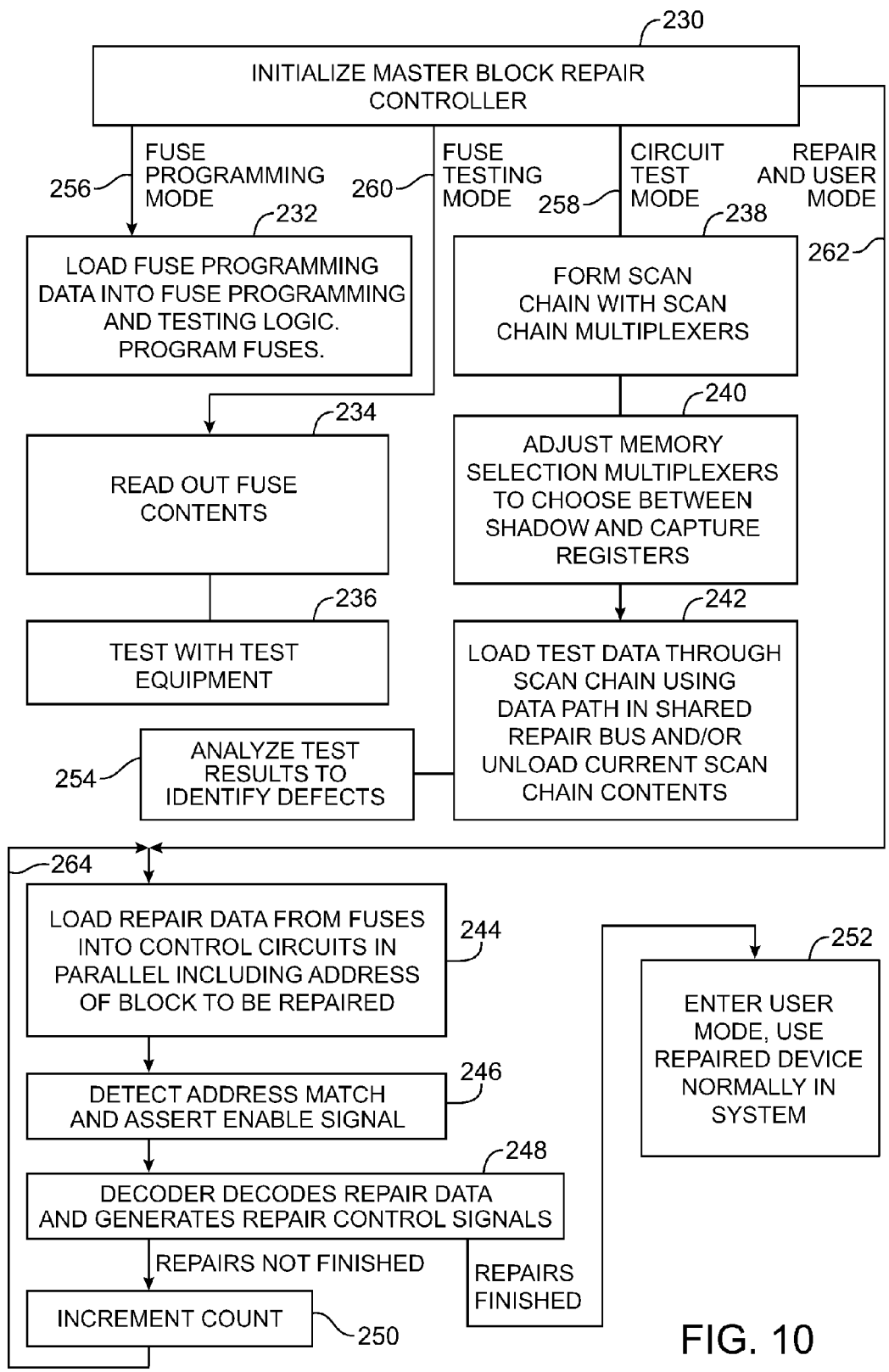
FIG. 10 is a flow chart of illustrative steps involved in using circuitry for providing redundancy on an integrated circuit in accordance with an embodiment of the present invention.

Illustrative steps involved in using redundant circuitry to repair an integrated circuit are shown in FIG. 10. As shown in FIG. 10, master block repair controller 100 (FIG. 5) can be initialized at step 230. With the arrangement of FIG. 7, for example, signal lines 160 may be used to supply control signals to master block repair controller logic 172. These signals may clear internal registers in master block repair controller logic 172 to prepare logic 172 for subsequent operations.

After initialization, programmable logic device integrated circuit 10 or another integrated circuit that contains redundant circuitry such as circuitry 86 of FIG. 5 or circuitry 170 of FIG. 7 may be placed into an appropriate mode of operation. For example, device 10 may be place in test mode for testing, in fuse programming mode for fuse programming, etc.

Initially, device 10 may be tested by placing device 10 into a circuit test mode, as indicated by line 258 of FIG. 10. Dedicated computing equipment that is sometimes referred to as a tester or test equipment may be used to control test operations. In a typical scenario, device 10 may be tested while in wafer form by probing the wafer with a probe. Device 10 may also be tested after a wafer has been divided into individual die (packaged or unpackaged die). Device 10 may be tested by probing an unpackaged die or by placing a packaged die in a test fixture.

During testing operations, one or more scan chains of registers may be formed using registers such as the registers of FIG. 9 and multiplexers such as multiplexers 182, 212, and 206 of FIG. 9. The formation of scan chains in device 10 (e.g., in control circuits 92) is represented by step 238 in FIG. 10. Scan chains may be used to test any suitable circuitry on device 10. For example, scan chains may be formed from registers in control circuit 92 to test control circuit 92 or to test associated programmable logic, as described in connection with FIG. 9.

At step 240, after forming a scan chain at step 238 (e.g., a scan chain through one or more control circuits 92), multiplexers such as multiplexers 190 and 206 that are responsive to signal TESTSELECT may be adjusted to select which portion of the control circuits 92 are to be tested. If TESTSELECT is high, the shadow registers such as shadow register 144 may be tested. If TESTSELECT is low, the capture registers such as capture register 130 may be tested.

At step 242, test data may be loaded through the scan chain using data path 124 of shared bus 94. Test data can also be captured into the registers of control circuitry 92 and unloaded using scan chains. If desired, test vectors may be applied to device 10 via pins 12. Test configuration data may also be loaded into memory elements 20 to configure certain portions of programmable logic 18 for testing. Additional scan chains may be used on device 10 to perform both data loading and data unloading operations during testing.

In general, during test mode testing, both memory elements 20 and circuitry (e.g., circuitry that is configured by memory elements 20) can be tested. Test results may be obtained by monitoring the signals that are generated on pins 14 in response to the applied test vectors. Test results may also be obtained by capturing data in internal registers and by scanning out the captured data through scan chains for evaluation (e.g., using steps such as step 242).

Test results may be analyzed by a tester or other computing equipment to determine whether device 10 is functioning properly or whether device 10 contains defective circuitry. Tests may, for example, reveal that a programmable logic circuit is defective. The corresponding row or column of memory that would normally contain the configuration data for programming the defective circuit may therefore also be considered to be defective. Some tests may also reveal defects in the actual memory cells of blocks 88. The analysis of test results to identify defective rows (or columns) in the memory blocks 88 on device 10 is shown as step 254 in FIG. 10.

After identifying the location of rows or columns in memory blocks 88 that need to be repaired either because these rows or columns contain defective memory cells or because these rows or columns are used to configure programmable logic that contains a defect, test equipment or other suitable computing equipment can generate repair data for device 10. Device 10 may then be placed in fuse programming mode, as indicated by line 256 of FIG. 10.

At step 232, the repair data for device 10 may be located into fuses 24 and fuse programming and testing logic 106 (FIG. 5) or fuses and fuse programming and testing logic 164 of FIG. 7. At this stage, the repair data is used to program fuses 24, so this data is sometimes referred to as fuse programming data. Fuses 24 may be polysilicon fuses or other suitable nonvolatile memory components. The fuses may be electrically programmed during step 232 (e.g., using the programming capabilities of logic 106 (FIG. 5) or logic 164 (FIG. 7). If desired, fuses 24 or other suitable nonvolatile storage may be programmed using laser programming techniques.

After programming fuses 24 at step 232, device 10 may be placed in fuse testing mode, as indicate by line 260. During fuse testing mode, the fuse testing capabilities of device 10 such as the testing logic in fuse programming and testing logic 106 of FIG. 5 and the testing logic of fuses and fuse programming and testing logic 164 of FIG. 7 may be used to test the fuses. At step 234, for example, the contents of the fuses that have been programmed can be read out. At step 236, the version of the repair data that has been programmed into the fuses and read out from the fuses after programming can be compared to the known correct version of the repair data that has been stored in external test equipment. If the data that is read out from the fuses matches the desired fuse data, the test equipment can conclude that fuse programming was successful. If the data that is read out from the fuse does not match the desired fuse data, an error has occurred during fuse programming. When the test equipment determines that the fuses have not been programmed properly, device 10 can be discarded or fuse programming operations may be repeated at step 232.

Following successful programming and testing of the fuses in device 10, device 10 can be prepared for use by an end user. For example, if device 10 has not been packaged in an integrated circuit package, device 10 can be packaged. Device 10 may then be shipped to an end user. The repair data that has been stored in the fuses will not change during shipping, because the fuse are nonvolatile. Because no further actions are required by the manufacturer of device 10 following fuse programming and successful testing, devices whose fuses have been loaded with repair data are sometimes referred to as being "repaired."

When it is desired to use the device in a system, the device may be placed in repair and user modes, as shown by line 262. During repair and user modes, device 10 is powered up and the repair data that has been stored in fuses 24 is loaded into control circuits 92 through bus 94 to configure associated switching circuitry 152 in memory blocks 88. This configures device 10 so that defective rows or columns of memory blocks 88 are bypassed and so that spare circuits are switched into use.

At step 244, the repair data that is stored in fuses 24 may be loaded from fuses 24 into control circuits 92. Each control circuit 92 may be identified by a unique address, so that repair data can be routed where appropriate. With control circuitry of the type shown in FIGS. 6 and 9 is used, each control circuit 92 may contain a capture register 130 and a shadow register 144. During step 244, all of the capture registers 130 are loaded in parallel using data line 124 in bus 94. The data that is loaded into the control circuits includes repair data for a given memory block (e.g., settings for the switching circuitry 152 in that block) and address data. The address data specifies which of the control circuits 92 is to use the repair data.

During step 246, address comparator circuitry 136 in each control circuit 92 compares the address that has been loaded into address register portion 132 of capture register 130 to the hardwired address for that control block that is stored in its stored block address circuit 140. If no match is detected, the control circuitry does not further process the loaded repair data in its capture register. During subsequent operations, this loaded repair data is discarded and replaced by another set of repair data corresponding to another address. If, however, a match is detected during step 246, the control circuit 92 can transfer the repair data from the repair data portion 131 of its capture register into its shadow register 144.

If repairs are not complete, a control circuit count may be incremented at step 250. For example, if repair data has been successfully loaded into a first control circuit, the count may be incremented by one to load data into a second control circuit. As indicated by line 264, following the increment of the count, operations may loop back to step 244, so that subsequent control circuits and their associated memory blocks can be provided with repair data. During data loading operations, master block repair controller 100 (FIG. 5) and fuses and fuse programming and testing logic 164 (FIG. 7) may transmit repair data and address information from fuses 24 to control circuits 92 over bus 94 as signal DATA. Because each control circuits 92 and its associated memory block 88 may be individually addressed, it is not necessary to provide repair data for each control circuit 92 and memory block 88 in a particular order. The control circuits 92 can be addressed using an increasing count, using a decreasing count, randomly, or in any other suitable order. Memory blocks 88 that do not contain defects can be skipped.

After all desired control circuits 92 have been addressed and provided with repair data, the outputs of the shadow register 144 in each control circuit 92 will be providing undecoded repair control signals to an associated decoder 150. Each decoder 150 may decode the undecoded repair control signals on its inputs to produce decoded repair control signals on its outputs. A path 90 may be associated with each decoder to apply the repair control signals on its outputs to the control inputs of multiplexers such as multiplexers 32 of FIG. 2 or other switching circuitry 152. This configures the multiplexers or other switching circuitry in all of the memory blocks 88 so that redundant circuitry is switched into place and rows or columns of memory arrays 88 that require repair are bypassed.

Once device 10 has been completely repaired in this way, the device can be place in user mode (step 252). During user mode, the repaired circuitry of device 10 may be used normally in a system.

The foregoing is merely illustrative of the principles of this invention and various modifications can be made by those skilled in the art without departing from the scope and spirit of the invention.

What is claimed is:

1. An integrated circuit, comprising:
    a plurality of circuit blocks each having spare circuitry and switching circuitry for switching the spare circuitry into use to repair defects;
    a plurality of control circuits that control the switching circuitry based on repair data, wherein each control circuit is associated with a respective one of the plurality of circuit blocks and has a unique address;
    a bus that is connected to each of the plurality of control circuits;
    memory that stores the repair data for the circuit blocks; and
    a master block repair controller that distributes the repair data from the memory to the plurality of control circuits over the bus using the unique addresses.

2. The integrated circuit defined in claim 1 wherein the bus includes a single data line over which the master block repair controller transmits the repair data.

3. The integrated circuit defined in claim 1 wherein the bus includes a single data line and a plurality of control lines.

4. The integrated circuit defined in claim 1 wherein each control circuit includes a capture register that receives the addresses and the repair data from the master block repair controller.

5. The integrated circuit defined in claim 1 wherein each control circuit includes a capture register and a shadow register that is loaded from the capture register.

6. The integrated circuit defined in claim 1 wherein each control circuit includes an address comparator that monitors which addresses are supplied on the bus by the master block repair controller.

7. The integrated circuit defined in claim 1 wherein the bus includes a data line and wherein each control circuit includes:
    a capture register that is connected to the bus and that receives the addresses and the repair data from the master block repair controller over the data line;
    stored block address circuitry that stores the address associated with that control circuit; and
    address comparator circuitry that compares the stored address in the stored block address circuitry to the addresses in the capture register that are received over the data line.

8. The integrated circuit defined in claim 1 wherein the bus includes a data line and wherein each control circuit includes:
    a capture register that is connected to the bus and that receives the addresses and the repair data from the master block repair controller over the data line;
    stored block address circuitry that stores the address associated with that control circuit;
    address comparator circuitry that compares the stored address in the stored block address circuitry to the addresses in the capture register that are received over the data line; and
    a shadow register that is loaded by the address comparator circuitry with repair data from the capture register when the address comparator circuitry detects a match between the stored address in the stored block address circuitry and one of the received addresses.

9. The integrated circuit defined in claim 1 further comprising:
    testing control circuitry that supplies test data; and
    multiplexing circuitry, wherein the bus includes a single data line, wherein the multiplexing circuitry has a test data input, the multiplexing circuitry has a repair data input that receives the repair data from the master block repair controller, and the multiplexing circuitry has a corresponding data output that is connected to the single data line, so that the multiplexing circuitry selectively routes the test data from the test data input to the single data line during test operations and routes the repair data from the repair data input to the single data line during repair operations.

10. The integrated circuit defined in claim 1 wherein the memory comprises fuses, the integrated circuitry further comprising fuse programming circuitry.

11. The integrated circuit defined in claim 1 wherein each of the control circuits comprises register circuitry that receives the addresses and repair data and decoder circuitry that decodes at least some of the repair data to produce decoded repair control signals, wherein the decoded repair control signals are applied to the switching circuitry in the memory block associated with that control circuit to configure the switching circuitry to bypass defective circuitry.

12. The integrated circuit defined in claim 1 wherein each of the circuit blocks comprises random-access-memory that stores data signals produced during operation of the integrated circuit.

13. The integrated circuit defined in claim 1 further comprising programmable logic, wherein each of the circuit blocks comprises a memory array that contains configuration random-access-memory cells in which configuration data is loaded to configure the programmable logic to perform a custom logic function.

14. An integrated circuit, comprising:
    a plurality of memory blocks, each memory block having spare circuitry and switching circuitry for switching the spare circuitry into use to repair defects within that memory block;

memory that stores a memory block address and corresponding repair data for each of the plurality of memory blocks;

a plurality of control circuits each of which is associated with a respective one of the memory blocks and each of which controls the switching circuitry for that memory block based on the repair data for that memory block; and a controller that uses a bus and the memory block addresses to provide the repair data to each one of the plurality of control circuits.

15. The integrated circuit defined in claim 14 wherein the memory blocks comprise configuration random-access-memory cells that store programming data for the integrated circuit.

16. The integrated circuit defined in claim 14 wherein the memory blocks comprise random-access-memory that is used to store data that is generated during operation of the integrated circuit.

17. The integrated circuit defined in claim 14 wherein each control circuit includes a stored block address circuit that has an associated hardwired address, wherein each control circuit includes a register that receives the memory block addresses and corresponding repair data from the bus, and wherein each control circuit includes address comparator circuitry that compares the hardwired address in its stored block address circuit to the memory block addresses received by the register.

18. An integrated circuit, comprising:
a plurality of memory blocks;
a plurality of control circuits;
memory that stores, for each of the plurality of memory blocks, repair data and the address of a control circuit in the plurality of control circuits that is associated with that memory block; and a controller that retrieves the stored repair data from the memory and that provides the addresses and the repair data to each of the control circuits in parallel, wherein each control circuit stores the repair data that corresponds to its address to repair its associated memory block.

19. The integrated circuit defined in claim 18 wherein the controller provides the addresses and the repair data to each of the control circuits over a shared bus.

20. The integrated circuit defined in claim 19 wherein the bus contains a single data line and wherein each control circuit comprises:
a capture register coupled to the single data line;
a shadow register that receives the repair data from the capture register; and
a decoder that receives undecoded repair control signals from the shadow register and that produces corresponding decoded repair control signals for the switching circuitry in the memory block that is associated with that control circuit.

21. The integrated circuit defined in claim 19 further comprising multiplexer circuitry having a first input that receives a test data signal, having a second input that receives the addresses and the repair data from the controller, and having an output that is connected to a data line in the bus.

* * * * *